United States Patent [19]
Fournel

[11] Patent Number: 6,097,646
[45] Date of Patent: Aug. 1, 2000

[54] METHOD FOR THE TESTING OF A DYNAMIC MEMORY

[75] Inventor: Richard Fournel, Lumbin, France

[73] Assignee: STMicroelectronics S.A., Gentilly, France

[21] Appl. No.: 09/219,470

[22] Filed: Dec. 23, 1998

[30] Foreign Application Priority Data

Dec. 24, 1997 [FR] France .................................. 97 16466

[51] Int. Cl.[7] .................................................. G11C 7/00
[52] U.S. Cl. ...................................... 365/201; 365/189.09
[58] Field of Search .............................. 365/201, 189.09

[56] References Cited

U.S. PATENT DOCUMENTS

| | | | |
|---|---|---|---|
| 5,568,435 | 10/1996 | Marr | 365/201 |
| 5,570,317 | 10/1996 | Rosen et al. | 365/200 |
| 5,748,544 | 5/1998 | Hashimoto | 365/201 |

FOREIGN PATENT DOCUMENTS 0 788 585 A1  6/1997  European Pat. Off. ........ G11C 29/00

*Primary Examiner*—David Nelms
*Assistant Examiner*—M. Tran
*Attorney, Agent, or Firm*—Theodore E. Galanthay; Allen, Dyer, Doppelt, Milbrath & Gilchrist, P.A.

[57] ABSTRACT

A method for the testing of the retention time of a piece of information in a dynamic memory cell includes increasing the leakages of current in this cell to accelerate the loss of information. Under these testing conditions, a reduced retention time is controlled to approach the true retention time obtained under conditions of normal reading. This method makes it possible to reduce the time taken to test the retention time of the dynamic memories while at the same time being very reliable.

38 Claims, 2 Drawing Sheets

METHOD FOR THE TESTING OF A DYNAMIC MEMORY

FIELD OF THE INVENTION

The present invention relates to memories, and, more particularly, to a method for testing a dynamic memory.

BACKGROUND OF THE INVENTION

The principle of dynamic storage relies on the holding, for a very short period of about one millisecond, of the charge of a capacitance associated with a MOS transistor. Thus, a dynamic memory is characterized especially by its period of retention of a piece of information. This sets the minimum data refreshing frequency needed to preserve the information in the memory. The refreshing of the data is obtained by setting up a read type access and then a write type access on each of the cells of the memory.

The retention time of a dynamic memory depends on the technology used, variations inherent in the manufacturing process, the structure of the memory cell, the supply and bias voltages used, and the memory. The retention time is tested on each of the cells of the dynamic memories at the end of manufacture. The testing of this retention time actually comprises two steps.

A first step known as a characterizing step includes making very precise measurements of this retention time on one or more cells of a batch of dynamic memory circuits. A value is obtained characterizing the memory and its method of manufacture for a batch or series of batches. The measurement of the retention time is done in practice by successive approximations, in specifying the real retention time by increasingly approaching values. In one practical example, a "1" is written in a cell of the dynamic memory, then reread at the end of one millisecond for example. If a "0" is read, it means that the information has been lost. Since the data has been lost, the "1" has to be rewritten and then a read access has to be done again, but at the end of a shorter period of time, such as, 500 microseconds for example. If a "1" is read, it means that the retention time in the example ranges from 500 microseconds to 1 millisecond.

Since a "1" has been read, the read access has refreshed the data element. It is possible to carry out a new read access after a slightly longer period of time, such as, 750 microseconds, for example. This procedure is continued until the value of the retention time has been specified with sufficient precision.

Once one or more manufactured batches of DRAMs have been characterized, all the memories of these lots are tested. This operation is designed to ascertain that all the cells of all these memories have a retention time included in the interval that has been measured for characterization. This is the testing step.

This testing step is very lengthy. Indeed, the retention time has to be guaranteed for each of the cells of each of the memories. Furthermore, it is not possible to limit the operations to only one reading per cell. Ideally it is necessary, in each memory, to measure these values for all the positions of a single '1' among the zeros and a single zero among the '1''s. In practice, only 5 or 6 readings are done per cell with tests known as zero-field tests, one-field tests, and checkerboard pattern tests.

Even if it is possible to carry out word access operation, the retention times with current technologies being about 1 millisecond, it is already necessary to take up nearly 25 seconds for testing just one 1-megabit memory. The testing of the dynamic memories is therefore very lengthy which means that it is very costly.

SUMMARY OF THE INVENTION

In view of the foregoing background, it is therefore an object of the invention to provide a method for the testing of dynamic memories that enables a major reduction in testing times without accepting any loss in the reliability of the measurements made.

The invention uses the principle of retention of dynamic memories, namely capacitive holding. More specifically, the approach of the invention is based on the leakages that cause the loss of information in a dynamic memory cell. Indeed, the measurement of the retention time is nothing other than the measurement of the influence of the losses of current in the cell. These current losses are due partly to the bit line voltages, the bias voltages of the transistors used, and especially the bias voltage of the bulks when the transistors of the cells are MOS transistors made in wells (P type transistors using N well technology, N type transistors using triple well technology).

The principle of the invention is as follows: by acting in a controlled way on at least one of the factors that are known to increase the current leakages, a controlled and known reduction will be obtained in the retention time of the dynamic memory cell. A reduced retention time is obtained as opposed to the true retention time which is the retention time measured under the normal operational conditions of the memory.

In the testing method according to the invention, a reduced retention time is measured and it is ascertained that this time corresponds to the true retention time expected. Through this procedure, the testing time is very substantially reduced without any loss of quality (namely reliability).

In practice, to enable a comparison of the retention time of the measurement with the true retention time expected for the cell, it is enough, in the phase of characterizing the dynamic memory, to make a first characterization which will give the true retention time measured under normal conditions of operation, and a second characterization to measure the corresponding reduced value under conditions of modified operation which make it possible to increase the leakages in a known and controlled way. There is thus obtained the value (or interval of values) characteristic of the true retention time of the dynamic memory.

The method according to the invention gives rise to an additional step of characterization but, in return, a great deal of time is gained in testing memory cells. In the practical example of a true retention time of 1 millisecond, it is possible to obtain a reduced retention time of about a hundred microseconds.

Thus, the invention relates to a method for testing a dynamic memory comprising a step for the verification of the retention time of each of the cells of the memory. The verification step includes, for each cell, an operation for writing an information element in the cell and an operation for reading the cell at the end of a specified time. This verification step comprises a phase for the modification of operation between the write operation and the read operation to increase the leakage currents in the cell. The specified time corresponds to a reduced retention time in the cell.

Preferably, the phase for modifying the operation includes the modification of at least one bias voltage of one or more transistors of the memory cell. It may be the bit line voltage of the cell or the bias voltage for the bulk of one of more transistors of the cell. It may also be the gate control voltage of one or more access transistors of the cell. The choice of either modification or of a combination of these modifications depends on the structure of the cell and the reduced retention time to be obtained.

BRIEF DESCRIPTION OF THE DRAWINGS

Other features and advantages of the invention shall be described in detail in the following description given by way of an indication that in no way restricts the scope of the invention and is made with reference to FIGS. 1 and 2, each representing an exemplary dynamic memory cell of the prior art.

DETAILED DESCRIPTION OF THE PREFERRED EMBODIMENTS

Figure 1:
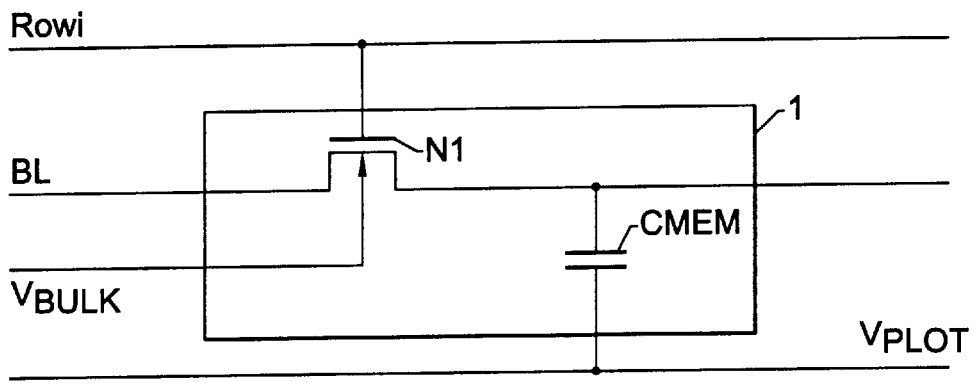

FIG. 1 shows an exemplary cell of a dynamic memory of the prior art. It is a memory known as the type with a MOS transistor with access by information bit. This structure has been chosen solely to illustrate the invention which can be applied to any type of dynamic memory cell structure.

The cell 1 thus comprises an access transistor N1 and an information storage capacitor which, in the example, is the capacitance of a capacitor CMEM. This capacitor is connected between the source of the access transistor and a bias line of a potential Vplot of about Vdd/2.

The access transistor N1 is controlled at its gate by a row selection line of the memory Rowi. The transistor N1 has its drain connected to a bit line referenced BL. This bit line is connected to an input/output amplifier circuit by associated bit line selection transistors (not shown).

The principle of storage and reading is well known. It is based on the voltage stored by the capacitor CMEM. Briefly, in write mode, if it is sought to write a 0, the 0 level (GND) is applied to the bit line BL. The row of the cell to be written is selected by applying an appropriate potential to the row selection line Rowi to turn the access transistor N1 on. The capacitor CMEM then stores a zero level.

If this cell is read before the information is lost (when the retention time is not exceeded), the bit line BL is precharged to Vdd/2. If the corresponding row selection line Rowi is activated to make the access transistor N1 conductive, the potential of the bit line will be modified according to the charge stored by the capacitor CMEM. The resulting potential is compared with the reference level Vdd/2.

The information is stored in the cell so long as the capacitor is not discharged. This capacitor gets discharged through the access transistor owing to the current leakages inherent in the structure. It is these leaks that determine the retention time of the dynamic memory cell.

In the invention, the biasing conditions of the access transistor of the cell are acted upon to increase the current leakages. Then, a reduced retention time is obtained. In testing, it is ascertained that the cell has a reduced retention time corresponding to the true retention time of the dynamic memory.

To increase the current leakages, it is possible to act on at least one of the potentials applied to the transistor of the cell. In the example shown, the access transistor N1 is an N type transistor made in a P type well. The bulk of an N type transistor is usually biased at a potential Vbulk connected to the ground GnD. According to the principle of the invention, between the write operation and the read operation of the verification step, it is possible to temporarily modify this bias potential Vbulk of the bulk and lower this potential by a transistor threshold voltage. In the example, there will then be Vbulk=Gnd−Vtn. In doing so, the leakage of current in the access transistor N1 and the capacitor CMEM is increased.

It is also possible to act on the bit line voltage. Indeed, in normal operation, it is common practice after a write operation to carry the bit line to a potential of some hundreds of millivolts (200 millivolts for example) to reduce the leakages due to the access transistor N1. In the invention, for the testing of the retention time, the bit line is taken to zero volts so as to increase the leakages with respect to a normal mode of operation. By temporarily biasing the bit line to zero volts in the verification step, between the write operation and the read operation, instead of 200 millivolts applied in normal operation mode, it is possible to obtain a reduced retention time of 100 microseconds instead of one millisecond obtained in normal operating mode. It is also possible to act on the gate voltage of the access transistor.

The invention has been explained with reference to FIG. 1. It can be applied more generally to all the DRAM cell structures. In particular, it can also be applied to cells that use the MOS transistor gate parasitic capacitance as a storage capacitor and have several access transistors.

Figure 2:
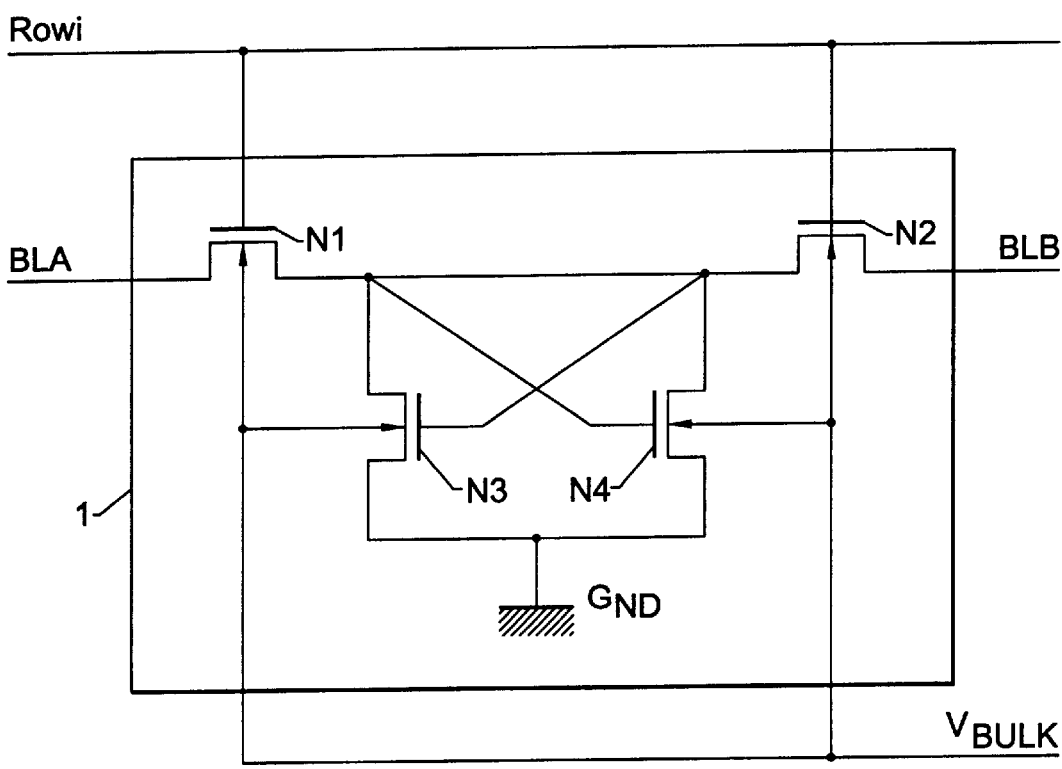

FIG. 2 thus shows an exemplary structure of a DRAM cell with four MOS transistors per bit: two access transistors N1 and N2 and two storage transistors N3 and N4. These four transistors are all herein of an N type, made in P type wells. Ideally, there is one well for the access transistors and one well for the storage transistors but, in general, to gain space, there is only one well in which the four transistors are made. In the example, they are made in the same well and their bulk is at a same potential Vbulk equal to the ground potential.

The two access transistors N1 and N2 are controlled at their gate by the same row selection line of the memory Rowi. The transistor N1 has its drain connected to a bit line BLA while the transistor N2 has its drain connected to the complementary bit line BLB.

The storage transistors N3 and N4 have their source connected to the ground Gnd. Their drain is connected to the source of the associated access transistor: N1 for the transistor N3 and N2 for the transistor N4. Finally, the gate of one storage transistor is connected to the drain of the other storage transistor (and therefore to the source of the access transistor associated with this other storage transistor). This dynamic memory cell structure is also known as the quasi-static RAM memory cell QSRAM for it is derived from the structure of a static RAM.

In this case, the principle of the invention includes modifying at least one of the bias potentials of the cell, preferably the bit line potential BLA or BLB and/or the bulk potential Vbulk of the storage transistors and/or the access transistors. It is possible to modify the bulk potential of only one of the groups of transistors, preferably the storage transistors, if these two groups are made in two different wells.

In any case, what has to be done is to temporarily modify at least one of the bias voltages applied to the cell, between the write operation and the read operation, to increase the current leaks, but without damaging the cell (without causing stress to it). The choice of one or more bias voltages to be modified depends on the structure of the dynamic memory cell in question, of which FIGS. 1 and 2 represent only some examples of the prior art. The method of the invention can be applied as well to P type transistor cells, and to transistor cells without wells. It is not limited to the structures described in the present application.

According to the structure of the cell and the reduced retention time to be achieved, action will be taken on only one of the bias voltages of the transistors of the cell or on several voltages at a time. The method of the present invention can be used to obtain a reduced retention time that is far smaller than the true retention time corresponding to the normal conditions of operation (or use). For example, if this reduced retention time is equal to 100 microseconds for a true retention time of 1 millisecond, and when it is known that the test has to be performed on all the cells of all the memories at the end of manufacture, it is possible to realize the considerable gain in time obtained by the testing method according to the invention.

Furthermore, the verification tests thus include verifying the behavior under temperature. Now the temperature tests are costly in terms of equipment (for heating) and time. By using the reduced retention time to perform these temperature tests, precious time is gained. This entails the assumption that the steps for characterizing the true retention time and the reduced retention time comprise a phase of characterization in temperature.

In practice, the step of verifying a dynamic memory cell according to the invention will comprise an operation for writing an information element in the cell (under normal biasing conditions), an operation for temporarily modifying a potential of at least one of the transistors of the cell to increase the current leaks in this cell, and then a read operation (under normal biasing conditions) at the end of a specified time corresponding to the expected reduced retention time.

Figure 3:
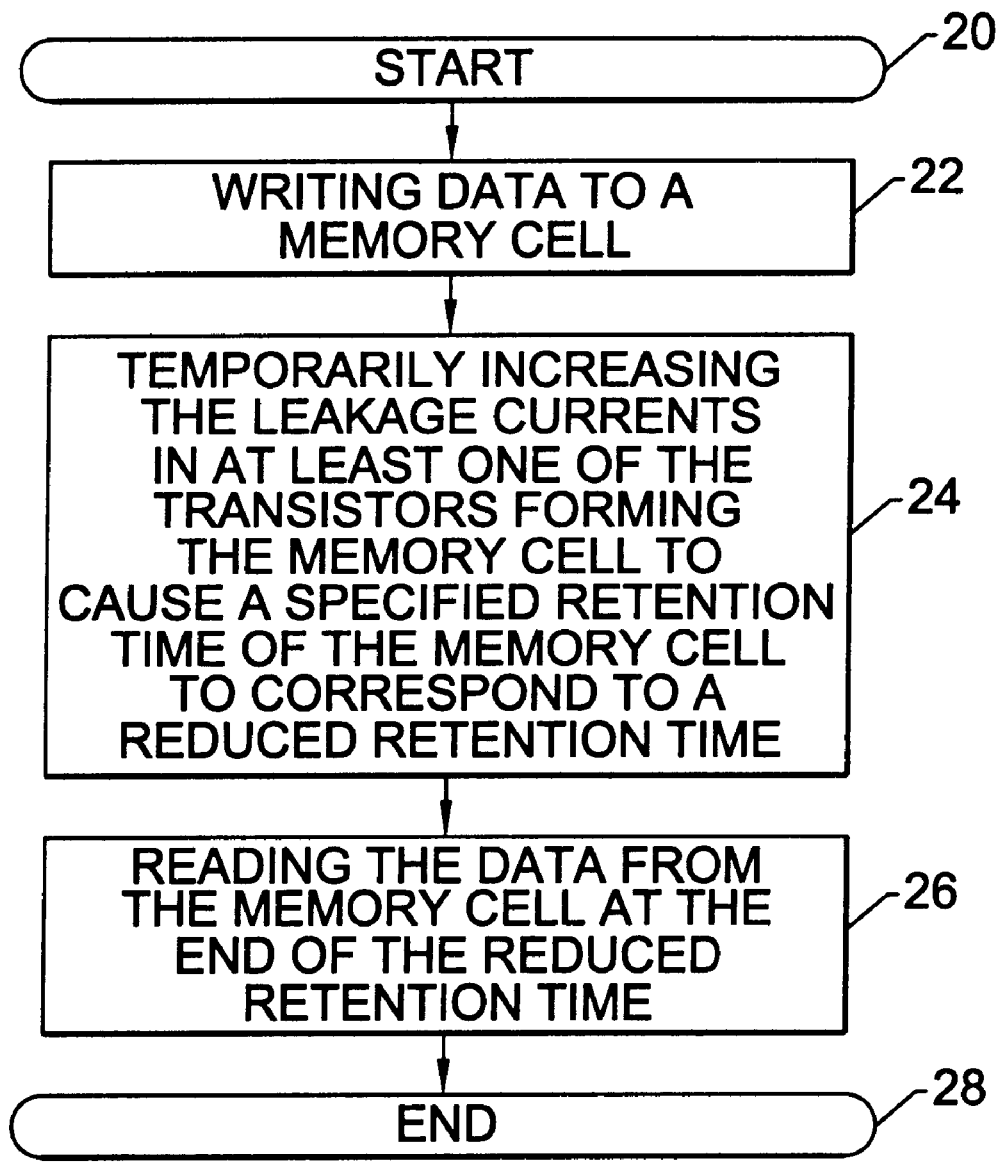
FIG. 3 is a flow chart illustrating the method for testing a dynamic memory in accordance with the present invention.

This expected reduced retention time is determined in an additional characterizing step prior to the verification step in which this duration is measured under specified modified access conditions. A flow chart illustrating the method for testing a dynamic memory in accordance with the present invention will now be described with reference to FIG. 3. From the start at Block 20, the method for testing a dynamic memory comprises the step of verifying a retention time of each of the memory cells of the dynamic memory, wherein each memory cell comprises one or more transistors. The verifying step includes the steps of writing an information element to the memory cell at Block 22, and temporarily increasing leakage currents in at least one of the transistors to cause a specified time of the memory cell to correspond to a reduced retention time at Block 24. The method further includes the step of reading the information from the memory cell at the end of the reduced retention time at Block 26. The method of the present invention obtains a reduced retention time that is smaller than the true retention time corresponding to the normal conditions of operation. A significant amount of time is thus gained in testing a dynamic memory by temporarily reducing the retention time of each memory cell. It is thus possible to establish the correspondence between the tested reduced retention time and the true retention time that is characteristic of the memory and guaranteed for users of these memories, in a range of temperature.

That which is claimed is:

1. A method for testing a dynamic memory comprising the step of:

verifying a retention time of each of the memory cells of the dynamic memory, each memory cell comprising one or more transistors in at least one well biased by at least one well bias potential, the verifying step comprising the steps of writing an information element in the memory cell, reading the information in the memory cell at the end of a specified retention time after the writing step, and temporarily modifying at least one well bias potential of the one or more transistors of the memory cell to increase leakage currents during the specified time and thereby cause the specified retention time to correspond to a reduced retention time.

2. A method according to claim 1, wherein the one or more transistors of each memory cell comprises at least one access transistor connected to a bit line; and wherein the step of temporarily modifying comprises temporarily modifying at least one bias potential of the at least one access transistor.

3. A method according to claim 2, wherein the step of temporarily modifying comprises temporarily lowering a bias potential of the bit line.

4. A method according to claim 2, wherein the step of temporarily modifying comprises temporarily modifying a gate bias potential of the at least one access transistor.

5. A method according to claim 2, wherein the one or more transistors of the memory cell are MOS transistors; and wherein the step of temporarily modifying comprises temporarily modifying the at least one well bias potential of the at least one access transistor.

6. A method according to claim 1, wherein the one or more transistors of the memory cell comprises access transistors and storage transistors, the access transistors being in a well different from a well of the storage transistors; and wherein the step of temporarily modifying comprises temporarily modifying the well bias potential for the storage transistors.

7. A method according to claim 1, further comprising the step of:

characterizing the dynamic memory prior to the step of verifying to determine a true retention time characteristic of one or more manufactured batches of dynamic memories under normal biasing conditions.

8. A method according to claim 7, further comprising the steps of:

conducting a preliminary additional characterization to measure a reduced retention time while modifying the at least one well bias potential of the one or more transistors of the memory cell; and fixing the specified time used in the verifying step based upon the preliminary additional characterization.

9. A method according to claim 8, wherein the steps of characterizing and conducting a preliminary additional characterization are performed within a predetermined temperature range.

10. A method for testing a dynamic memory comprising the steps of:

characterizing the dynamic memory to determine a true retention time characteristic of one or more manufactured dynamic memories under normal biasing conditions;

conducting a preliminary characterization to measure a reduced retention time while modifying at least one bias voltage of one or more transistors of a memory cell; and verifying a retention time of each of the memory cells, each memory cell comprising one or more transistors, the verifying step comprising the steps of writing an information element in the memory cell, reading the information in the memory cell at the end of a specified retention time after the writing step, the specified time based upon the preliminary characterization, and temporarily modifying at least one biasing potential of the one or more transistors of the memory cell to increase leakage currents during the specified time and thereby cause the specified retention time to correspond to a reduced retention time;

wherein the steps of characterizing and conducting a preliminary additional characterization are performed within a predetermined temperature range.

11. A method according to claim 10, wherein the one or more transistors of each memory cell comprises at least one access transistor connected to a bit line; and wherein the step of temporarily modifying comprises temporarily modifying at least one bias potential of the at least one access transistor.

12. A method according to claim 11, wherein the step of temporarily modifying comprises temporarily lowering a bias potential of the bit line.

13. A method according to claim 11, wherein the step of temporarily modifying comprises temporarily modifying a gate bias potential of the at least one access transistor.

14. A method according to claim 10, wherein the one or more transistors of the memory cell are MOS transistors in at least one well biased by at least one well bias potential; and wherein the step of temporarily modifying comprises temporarily modifying the at least one well bias potential.

15. A method according to claim 14, wherein the one or more transistors of the memory cell comprises access transistors and storage transistors, the access transistors being in a well different from a well of the storage transistors; and wherein the step of temporarily modifying comprises temporarily modifying the well bias potential for the storage transistors.

16. A method for testing a dynamic memory comprising the step of:
verifying a retention time of each of the memory cells of the dynamic memory, each memory cell comprising one or more MOS transistors in at least one well biased by at least one well bias potential, the verifying step comprising the steps of
writing an information element in the memory cell,
reading the information in the cell at the end of a specified retention time after the writing step, and
temporarily modifying at least one well bias potential to increase leakage currents during the specified time and thereby cause the specified retention time to correspond to a reduced retention time,
the one or more MOS transistors in each memory cell comprises at least one access transistor connected to a bit line so that the step of temporarily modifying comprises temporarily modifying at least one bias potential of the at least one access transistor.

17. A method according to claim 16, wherein the step of temporarily modifying comprises temporarily lowering a bias potential of the bit line.

18. A method according to claim 16, wherein the step of temporarily modifying comprises temporarily modifying a gate bias potential of the at least one access transistor.

19. A method according to claim 16, wherein the one or more MOS transistors of each memory cell further comprises at least one storage transistor, the at least one access transistor being in a well different from a well of the at least one storage transistor; and wherein the step of temporarily modifying comprises temporarily modifying the well bias potential for the at least one storage transistor.

20. A method according to claim 16, further comprising the step of:
characterizing the dynamic memory prior to the step of verifying to determine a true retention time characteristic of one or more manufactured batches of dynamic memories under normal biasing conditions.

21. A method according to claim 20, further comprising the steps of:

conducting a preliminary additional characterization to measure a reduced retention time of the dynamic memory while modifying the at least one well bias potential; and fixing the specified time used in the verifying step based upon the preliminary additional characterization.

22. A method according to claim 21, wherein the steps of characterizing and conducting a preliminary additional characterization are performed within a predetermined temperature range.

23. A method for testing a dynamic memory comprising the step of:
verifying a retention time of each of the memory cells of the dynamic memory, each memory cell comprising one or more transistors, the verifying step comprising the steps of
writing an information element in the memory cell,
temporarily modifying at least one biasing potential of the one or more transistors of the memory cell from a normal value to a modified value to increase leakage currents during a specified time and thereby cause a specified retention time to correspond to a reduced retention time, and
reading the information element in the memory cell at the end of the specified retention time after the modified value of the at least one biasing potential of the one or more transistors of the memory cell has been removed.

24. A method according to claim 23, wherein each memory cell comprises at least one access transistor connected to a bit line; and wherein the step of temporarily modifying comprises temporarily modifying at least one bias potential of the at least one access transistor.

25. A method according to claim 24, wherein the step of temporarily modifying comprises temporarily lowering a bias potential of the bit line.

26. A method according to claim 24, wherein the step of temporarily modifying comprises temporarily modifying a gate bias potential of the at least one access transistor.

27. A method according to claim 24, wherein the one or more transistors of the memory cell are MOS transistors in at least one well biased by at least one well bias potential; and wherein the step of temporarily modifying comprises temporarily modifying the at least one well bias potential.

28. A method according to claim 27, wherein the memory cell comprises access transistors and storage transistors, the access transistors being in a well different from a well of the storage transistors; and wherein the step of temporarily modifying comprises temporarily modifying the well bias potential for the storage transistors.

29. A method according to claim 23, further comprising the step of characterizing the dynamic memory prior to the step of verifying to determine a true retention time characteristic of one or more manufactured batches of dynamic memories under normal biasing conditions.

30. A method according to claim 29, further comprising the steps of:
conducting a preliminary additional characterization to measure a reduced retention time while modifying the at least one bias voltage of the one or more transistors of the memory cell; and
fixing the specified time used in the verifying step based upon the preliminary additional characterization.

31. A method according to claim 30, wherein the steps of characterizing and conducting a preliminary additional characterization are performed within a predetermined temperature range.

32. A method for testing a dynamic memory comprising the steps of:

characterizing the dynamic memory to determine a true retention time characteristic of one or more manufactured dynamic memories under normal biasing conditions;

conducting a preliminary characterization to measure a reduced retention time while modifying at least one bias voltage of one or more transistors of a memory cell; and verifying a retention time of each of the memory cells, each memory cell comprising one or more transistors, the verifying step comprising the steps of writing an information element in the memory cell, temporarily modifying at least one biasing potential of the one or more transistors of the memory cell from a normal value to a modified value to increase leakage currents during a specified time and thereby cause a specified retention time to correspond to the reduced retention time, and reading the information element in the memory cell at the end of the specified retention time after the modified value of the at least one biasing potential of the one or more transistors of the memory cell has been removed.

33. A method according to claim 32, wherein the steps of characterizing and conducting a preliminary additional characterization are performed within a predetermined temperature range.

34. A method according to claim 32, wherein each memory cell comprises at least one access transistor connected to a bit line; and wherein the step of temporarily modifying comprises temporarily modifying at least one bias potential of the at least one access transistor.

35. A method according to claim 32, wherein the step of temporarily modifying comprises temporarily lowering a bias potential of the bit line.

36. A method according to claim 32, wherein the step of temporarily modifying comprises temporarily modifying a gate bias potential of the at least one access transistor.

37. A method according to claim 32, wherein the one or more transistors of the memory cell are MOS transistors in at least one well biased by at least one well bias potential; and wherein the step of temporarily modifying comprises temporarily modifying the at least one well bias potential.

38. A method according to claim 37, wherein the memory cell comprises access transistors and storage transistors, the access transistors being in a well different from a well of the storage transistors; and wherein the step of temporarily modifying comprises temporarily modifying the well bias potential for the storage transistors.

* * * * *